US006200877B1

United States Patent
Jeon et al.

(10) Patent No.: US 6,200,877 B1
(45) Date of Patent: Mar. 13, 2001

(54) METHOD OF FORMING A CHARGE STORAGE ELECTRODE HAVING A SELECTIVE HEMISPHERICAL GRAINS SILICON FILM IN A SEMICONDUCTOR DEVICE

(75) Inventors: Kwang Seok Jeon, Kyungki-Do; Jung Yun Mun, Seoul; Hoon Jung Oh, Kyungki-Do; Sang Ho Woo, Kyungki-Do; Seung Woo Shin, Kyungki-Do; Il Keoun Han, Kyungki-Do; Hong Seon Yang, Kyungki-Do, all of (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/294,348

(22) Filed: Apr. 20, 1999

(30) Foreign Application Priority Data

Apr. 22, 1998 (KP) .................................................. 98-14388

(51) Int. Cl.[7] .......................... H01L 21/20; H01L 21/302; H01L 21/461
(52) U.S. Cl. .......................... 438/398; 438/734; 438/735
(58) Field of Search ...................................... 438/398, 734, 438/706, 260, 735, 964, 694; 216/64, 96, 99

(56) References Cited

U.S. PATENT DOCUMENTS

| | | | |
|---|---|---|---|
| 4,680,085 | * 7/1987 | Vijan et al. | 156/643 |
| 5,100,504 | * 3/1992 | Kawai et al. | 156/643 |
| 5,366,917 | 11/1994 | Watanabe et al. | |
| 5,445,712 | * 8/1995 | Yanagida | 156/662 |
| 5,532,182 | * 7/1996 | Woo | 437/52 |
| 5,547,892 | * 8/1996 | Wuu et al. | 437/52 |
| 5,597,760 | 1/1997 | Hirota | |
| 5,618,747 | 4/1997 | Lou | |
| 5,623,243 | * 4/1997 | Watanabe et al. | 257/307 |
| 5,639,689 | * 6/1997 | Woo | 437/193 |
| 5,665,622 | 9/1997 | Muller et al. | |
| 5,702,968 | 12/1997 | Chen | |
| 5,741,741 | * 4/1998 | Tseng | 437/192 |
| 5,854,095 | * 12/1998 | Kang et al. | 438/255 |
| 5,908,735 | * 6/1999 | Kim et al. | 430/329 |

OTHER PUBLICATIONS

Sakai and Tatsumi, "Novel seeding method for the growth of polycrystalline Si films with hemispherical grains", Applied Physics Letters, pp. 159–161, Jul. 13, 1992.*

* cited by examiner

Primary Examiner—Matthew Smith
Assistant Examiner—Lex H. Malsawma
(74) Attorney, Agent, or Firm—Pennie & Edmonds LLP

(57) ABSTRACT

The present invention relates to semiconductor manufacturing field, more particularly, to a process of forming a charge storage electrode to which a selective hemispherical grains (HSG) silicon film is applied. The object of the present invention is to provide a method of forming a charge storage electrode having the selective HSG silicon film in semiconductor device which can secure a sufficient capacitor effective surface area by obtaining desired grain size at the time of selective HSG silicon film formation. The present invention prevents remaining of carbon component which obstructs the growth of HSG silicon film after dry etching process by limiting the carbon halide gas used in dry etching process of amorphous silicon film for defining the charge storage electrode at the time of process of forming the charge storage electrode having selective HSG silicon film. That is, the present invention is a technology of etching a part of amorphous silicon film by using general carbon halide gas at the time of dry etching process of the amorphous silicon film for defining the charge storage electrode, and then, finally etching the remaining part of amorphous silicon film by using silicon etching gas such as $SF_6$ gas, $Cl_2+O_2$ gas, HBr gas, etc. not containing carbon component or only using the etching gas such as $SF_6$ gas, $Cl_2+O_2$ gas, HBr gas, etc. not containing carbon component during selective etching of amorphous silicon film.

12 Claims, 9 Drawing Sheets

METHOD OF FORMING A CHARGE STORAGE ELECTRODE HAVING A SELECTIVE HEMISPHERICAL GRAINS SILICON FILM IN A SEMICONDUCTOR DEVICE

BACKGROUND OF THE INVENTION

1. Field of the Invention

The present invention relates to semiconductor manufacturing field, more particularly, to a process of forming a charge storage electrode to which a selective hemispherical grains (HSG) silicon film is applied.

2. Background of the Invention

In general, there exists a problem in that a capacitance of more than certain amount must be maintained to secure operational characteristics of a semiconductor device regardless of the fact that an area of unit cell is reduced as degree of integration of semiconductor device such as DRAM, etc. is increased.

To solve such problem, charge storage electrodes of a variety of 3-dimensional structures were proposed and attempts were made to secure a surface area of the charge storage electrode, however, there were problems in that the process of forming the charge storage electrode involves a high degree of difficulty and induces a large step after completion of the process so as to make subsequent processes difficult. In another scheme of solution, attempts were made to secure the capacitance by using a high dielectric material such as $Ta_2O_5$, $(Ba_{1-x}Sr_x)$ $T_1$ $_{O3}$ (referred to as BST), etc., however, there was a problem in that mass production was difficult since there were many insufficiencies related with processes to be solved to be applied to actual devices.

Recently, a technology for applying the hemispherical grains silicon film to the charge storage electrode has been proposed. This technology can be applied to a high integration semiconductor device of more than 256 mega class since it can increase the surface area of film by more than twice by indenting the surface of film by using a fine structure characteristics. A conventional process for forming the charge storage electrode having the hemispherical grains silicon film includes a process of growing the hemispherical grains silicon film on top of the entire structure of wafer to which a charge storage electrode contact hole is formed, a doping process, deglaze process and etch back process, however, there is a problem in that the productivity is reduced due to the increase of the number of processes, the occurrence of particle, etc..

To solve such problem, a technology for applying a selective HSG process in which the HSG silicon film grows only in a charge storage electrode formation region were proposed. This technology inevitably requires a dry etching process in a patterning process for defining the charge storage electrode and it was confirmed that kind of gas used in the dry etching process acts as a critical parameter which determines a selectibility of subsequent selective HSG process and size of grain. In particular, in case of using carbon halide gas (for example, $C_2F_6$, $CF_4$, $CHF_3$, $CCl_4$, etc.), there are problems in that the HSG silicon film is not formed, or even if formed, it can not obtain an effect of expanding the surface area of the charge storage electrode since the grain size of HSG is very small. This is because carbon(C) component, contained in the carbon halide gas which is the dry etching gas used in patterning the charge storage electrode, acts as an element which obstructs the formation of a necessary for formation of HSG silicon film by remaining after the etching process in an amorphous silicon film surface and an interlayer insulation film in which the HSG silicon film is to be selectively formed or obstructs surface migration of silicon atom after formation of seed.

The accompanying FIGS. 6a and 6b show Scanning Electron Microscope(SEM) photographs of a charge storage electrode having a selective hemispherical grains silicon film of simple stack structure formed according to the conventional technology described above. Condition of HSG silicon film growth in the top surface of charge storage electrode can be seen in FIG. 6a and that in the side surface of charge storage electrode in FIG. 6b. As shown in FIG. 6b, the side surface of charge storage electrode is less affected by carbon component during etching so as to show some degree of grain size of HSG silicon film, however, as shown in FIG. 6a, the top surface of charge storage electrode is affected by carbon component contained in carbon halide gas which is the dry etching gas so as to show unsatisfactory growth of grain of HSG silicon film.

SUMMARY OF THE INVENTION

The object of the present invention is to provide a method of forming a charge storage electrode having a selective hemispherical grains silicon film in a semiconductor device which can secure a sufficient capacitor effective surface area by obtaining desired grain size at the time of selective HSG silicon film formation.

The present invention prevents remaining of carbon component which obstructs the growth of HSG silicon film after dry etching process by limiting the carbon halide gas used in dry etching process of amorphous silicon film for defining the charge storage electrode at the time of process of forming the charge storage electrode having a selective hemispherical grains silicon film. That is, the present invention is a technology of etching a part of amorphous silicon film by using general carbon halide gas at the time of dry etching process of the amorphous silicon film for defining the charge storage electrode, and then, finally etching the remaining part of amorphous silicon film by using silicon etching gas such as $SF_6$ gas, $Cl_{2+O2}$ gas, HBr gas, etc. not containing carbon component during selective etching of amorphous silicon film.

A method of forming a charge storage electrode having a selective hemispherical grains silicon film in a semiconductor device provided by the technical principle of the present invention comprises the steps of:

a first step of forming an amorphous silicon film on top of the entire structure of wafer to which contact holes are formed;

a second step of selectively etching a part of said amorphous silicon film by using a carbon halide gas as a main etching gas;

a third step of selectively etching the remaining part of said amorphous silicon film by using a silicon etching gas not containing carbon component; and a fourth step of selectively forming a hemisphere grains silicon film at surface portion of said amorphous silicon film after performing the third step.

Also, a method of forming a charge storage electrode having a selective hemispherical grains silicon film in a semiconductor device comprising provided by the technical principle of the present invention comprises the steps of:

a first step of forming an amorphous silicon film on top of the entire structure of wafer to which contact holes are formed;

a second step of selectively etching said amorphous silicon film by using a silicon etching gas not containing carbon component as a main etching gas; and a third step of selectively forming a hemispherical grains silicon film at the surface portion of said amorphous silicon film after performance of said second step.

BRIEF DESCRIPTION OF THE DRAWINGS

The above object and other advantages of the present invention will become more apparent by describing in detail the preferred embodiment of the present invention with reference to the attached drawings in which.

Similar reference characters refer to similar parts in the several views of the drawings.

DETAILED DESCRIPTION OF THE INVENTION

Preferable embodiments of the present invention will be described in detail below with reference to the accompanying drawings.

The accompanying FIGS. 1a to 1e show a process of forming a charge storage electrode according to one embodiment of the present invention.

Figure 1A:
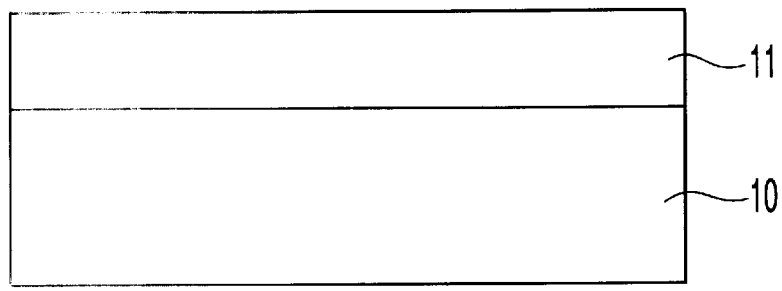
FIGS. 1a to 1e are sectional views showing a process of forming the charge storage electrode according to an embodiment of the present invention.

First, as shown in FIG. 1a, an interlayer insulation film 11 is deposited on top of the entire structure of a silicon substrate 10 which has gone through a predetermined process. Here, as the interlayer insulation film 11, an insulation film of single layer or multi-layer can be used, an oxide film doped with impurities such as Boro-Phospho Silicate Glass (BPSG), Boro Silicate Glass (BSG), Phospho Silicate Glass (PSG), etc., and an oxide film not doped with impurities such as desposited oxide film, thermal oxide film, and High Temperature Oxide (HTO) film. That is, the kind of interlayer insulation film 11 does not significantly affect the embodying of the present invention.

Figure 1B:
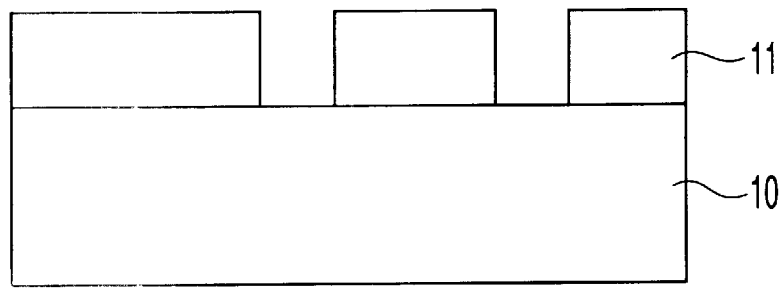

Next, as shown in FIG. 1b, contact holes 14 for charge storage electrode are formed by selectively etching the interlayer insulation film 11.

Figure 1C:
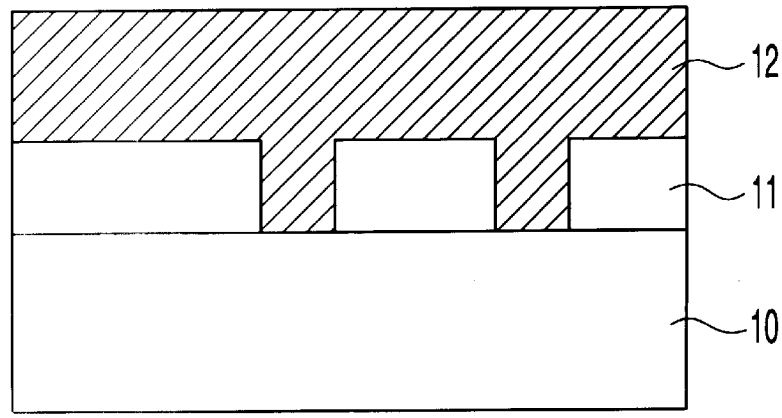

Then, as shown in FIG. 1c, an amorphous silicon film 12 doped with impurities, is deposited on top of the entire structure in which contact holes are formed. At this time, the amorphous silicon film 12 can be obtained from a silicon (Si) source such as $SiH_4$ gas, $Si_2H_6$ gas, etc., and a gas such as $PH_3$ gas, etc. containing phosphorus may be used as doping source. Of course, ion implantation process may be carried out after depositing the undoped amorphous silicon film.

Figure 1E:
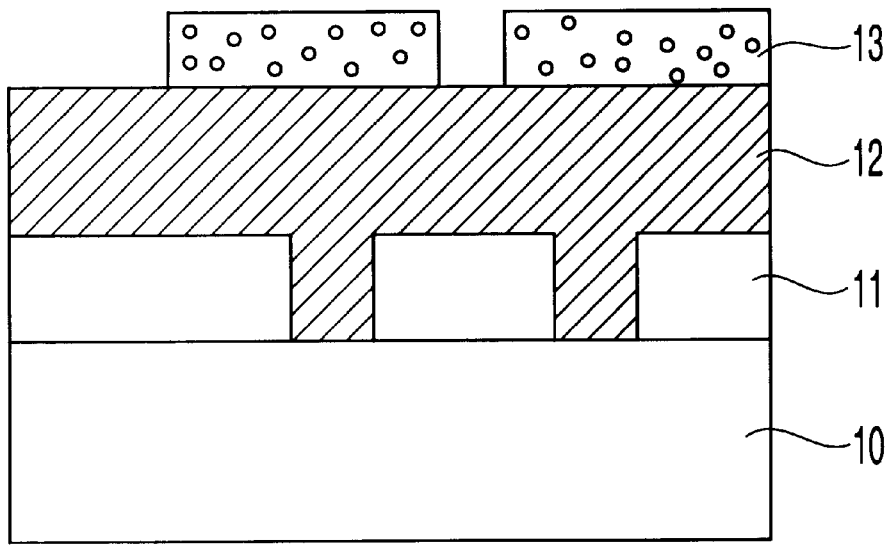
Figure 1D:
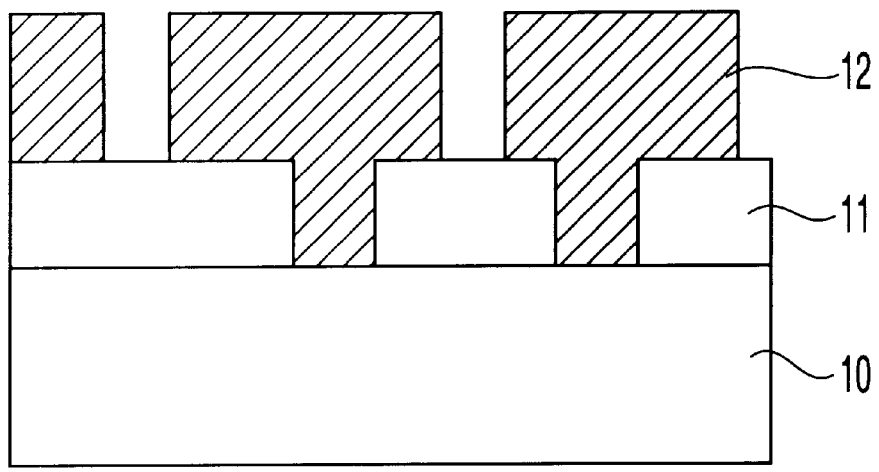

Next, as shown in FIG. 1d, a photoresist pattern 13 is formed on the amorphous silicon film 12 to define the charge storage electrode.

Next, as shown in FIG. 1e, the amorphous silicon film 12 is dry etched by using the photoresist pattern 13 as an etching mask. At this time, the dry etching is performed in two steps, that is, etching a part of the amorphous silicon film 12 by using the carbon halide gas such as $C_2F_6$, $CF_4$, $CHF_3$, $CCl_4$, etc., and etching the remaining part of the amorphous silicon film 12 by using $SF_6$ gas or $Cl_2+O_2$ gas. Here, the carbon halide gas has characteristics of excellent etch rate and etch bias, and $SF_6$ gas or $Cl_2+O_2$ gas prevents a phenomenon of suppressing the HSG silicon film growth due to carbon component at the time of subsequent selective HSG silicon film growth.

Thereafter, the HSG silicon film is formed by forming a seed for HSG silicon film on the surface portion of patterned amorphous silicon film 12 and making silicon atom at the surface portion of amorphous silicon film 12 to surfacewise move around the seed by carrying out an annealing at a temperature above 450° C. under high vacuum condition below $10^{-4}$ Torr.

Figure 2A:
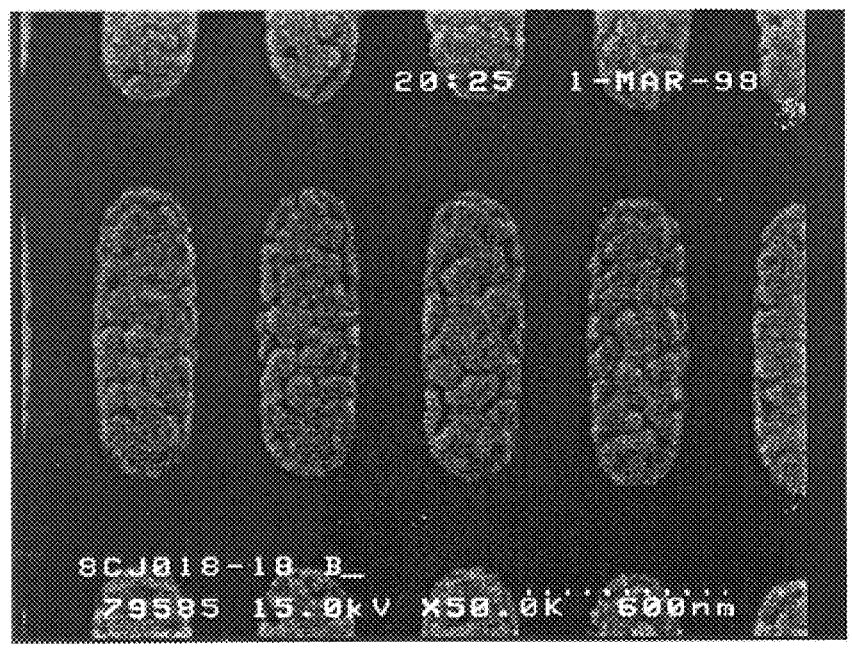
FIGS. 2a and 2b are SEM photographs of a charge storage electrode having a selective hemispherical grains silicon film of simple stack structure formed according to an embodiment of the present invention.
Figure 2B:
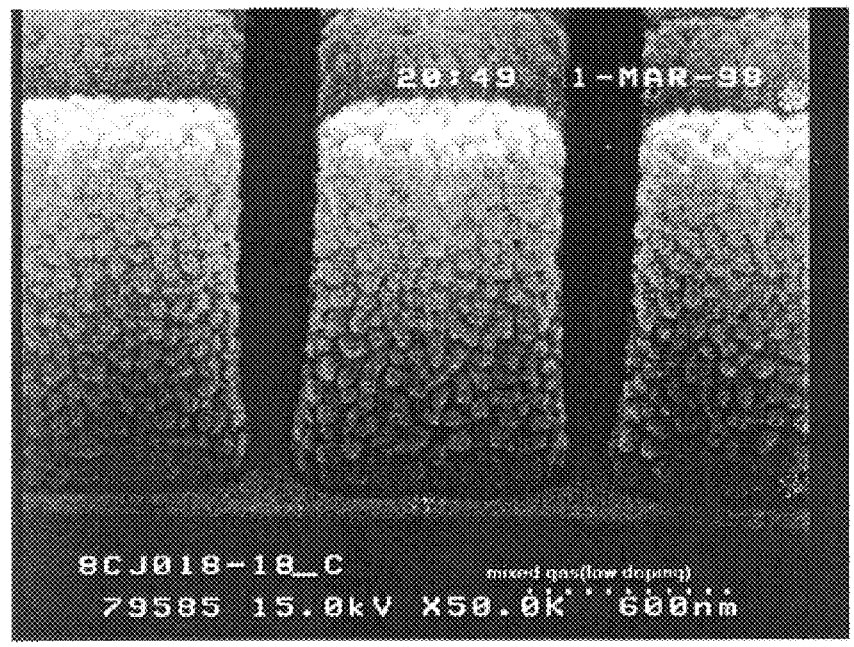
Figure 6A:
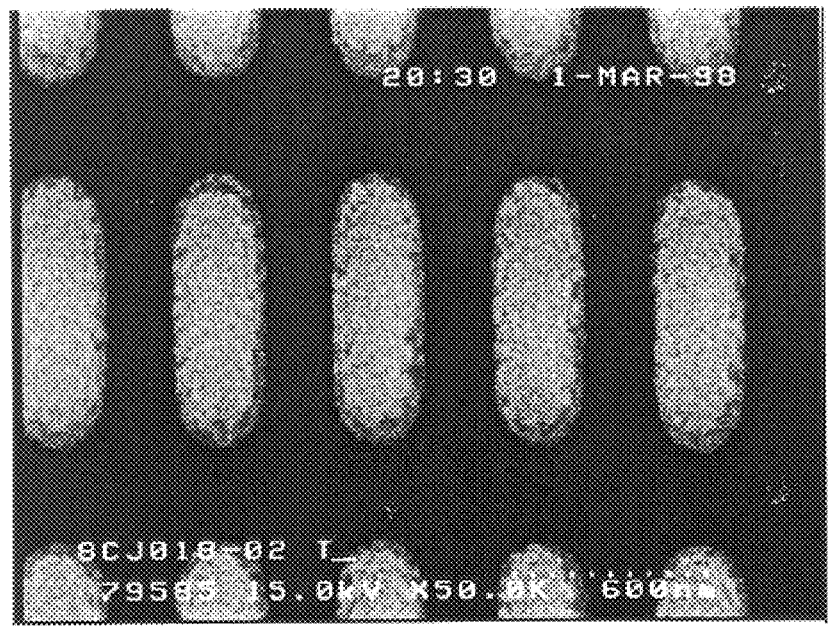
FIGS. 6a and 6b are SEM photographs of a charge storage electrode having a selective hemispherical grains silicon film of simple stack structure formed according to a conventional technology.
Figure 6B:
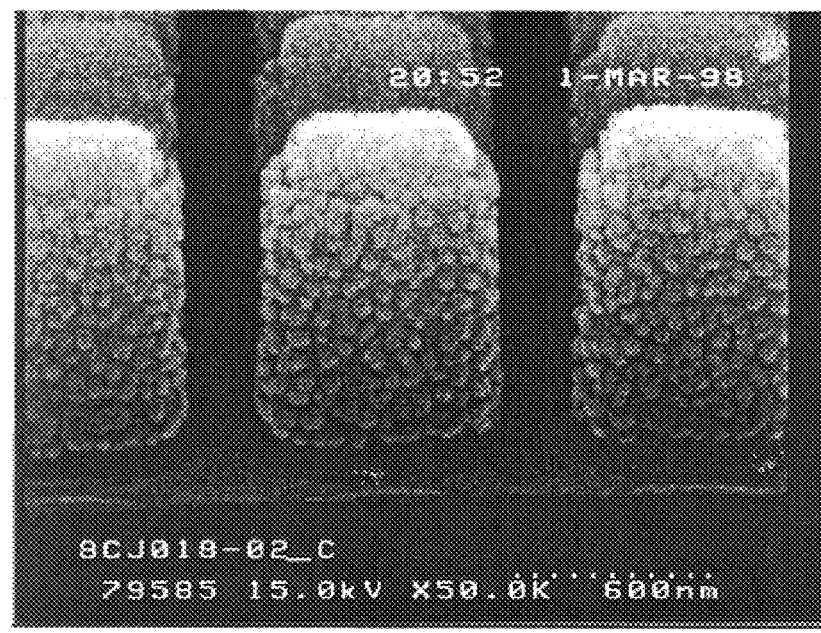

FIGS. 2a and 2b show SEM photographs of a charge storage electrode having a selective HSG silicon film of simple stack structure formed according to an embodiment of the present invention, showing a case of using $SF_6$ gas at the 2-step etching process of FIG. 1e described above. FIG. 2a shows a condition of HSG silicon film growth on top of charge storage electrode and FIG. 2b shows a condition of HSG silicon film growth at side surface of charge storage electrode. As shown in FIGS. 2a and 2b, sufficient grain size can be secured at both top surface and side surface of charge storage electrode. When compared with FIGS. 6a and 6b according to conventional technology described above, remarkable improvement of the present invention can be seen.

Figure 3A:
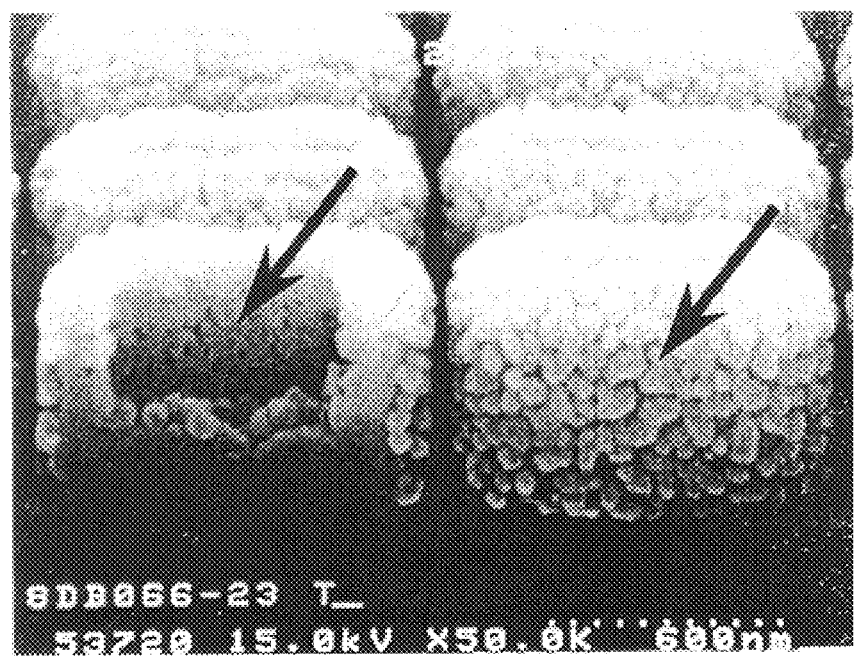
FIGS. 3a and 3b are SEM photographs of a charge storage electrode having a selective hemispherical grains silicon film of cylinder structure formed according to an embodiment of the present invention.
Figure 3B:
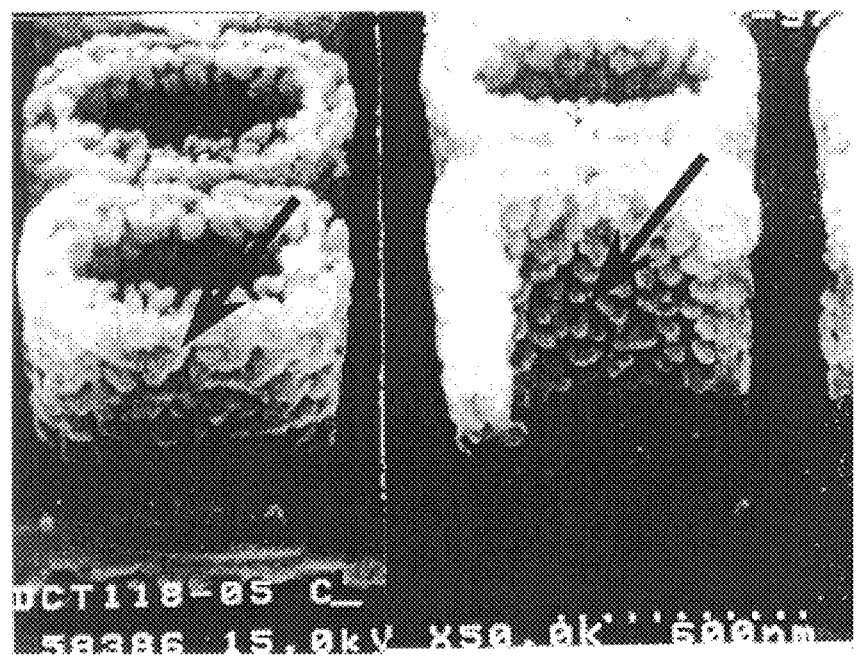

FIGS. 3a and 3b show SEM photographs of a charge storage electrode having a selective HSG silicon film of cylinder structure formed according to an embodiment of the present invention described above. Here, FIG. 3a shows a section of case of using $SF_6$ gas as an etching gas at the time of 2-step etching process described above and FIG. 3b shows a case of using $Cl_2+O_2$ gas. As shown in FIGS. 3a and 3b, a condition in which selective HSG silicon film grows to a sufficient size can be seen. That is, the present invention is not significantly affected by a shape of charge storage electrode.

Figure 4A:
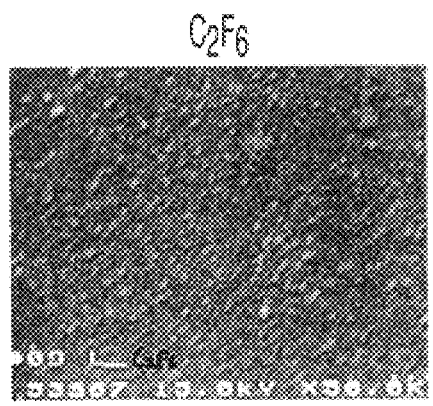
FIGS. 4a to 4e are SEM photographs of a hemispherical grains silicon film grown at the surface portion of the amorphous silicon film in a single type equipment.
Figure 4B:
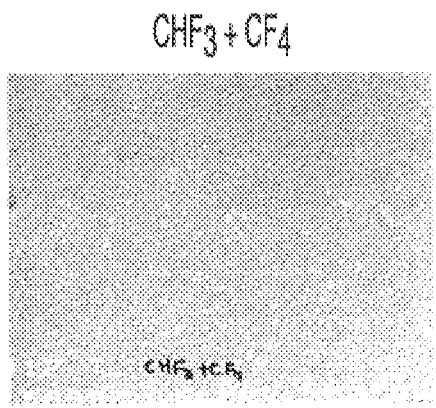
Figure 4C:
Figure 4D:
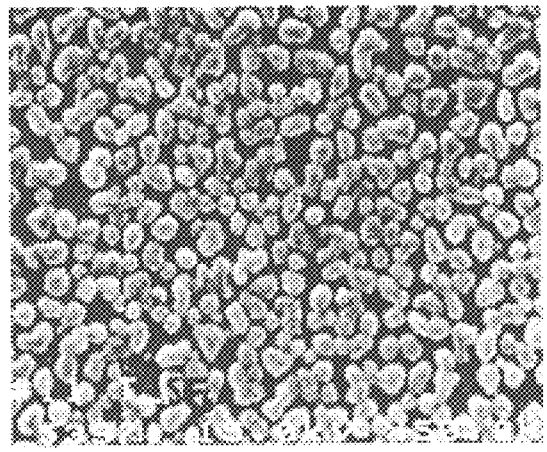
Figure 4E:
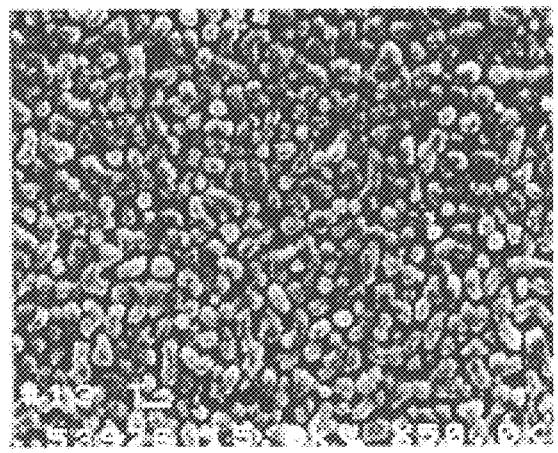

FIGS. 4a to 4e show SEM photographs of a HSG silicon film grown at the surface portion of the amorphous silicon film in a single type equipment, showing a condition of HSG silicon film growth on top of charge storage electrode according to each etching gas used in patterning of amorphous silicon film. Here, FIG. 4a shows a case of only using $C_2F_6$ gas, FIG. 4b shows a case of only using $CHF_3+CF_4$ gas and FIG. 4c shows a case of only using $CHF_3+Ar$ gas. That is, they show the cases in which the amorphous silicon film is patterned according to the conventional technology, and from the drawings, it can be seen the grain size of selective HSG silicon film is fine or the grain is almost not formed. On the other hand, FIGS. 4d and 4e show the cases of using $SF_6$ gas and $Cl_2+O_2$ gas, respectively, and from the drawings, it can be seen the grain size of selective HSG silicon film is sufficiently grown.

Figure 5A:
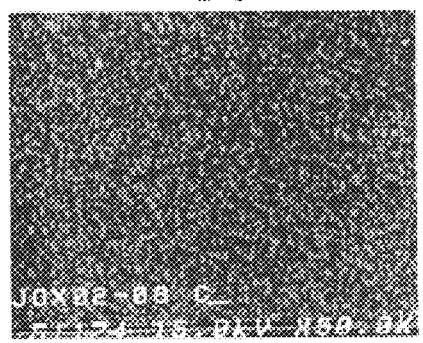
FIGS. 5a to 5e are SEM photographs of a hemispherical grains silicon film grown at the surface portion of the amorphous silicon film in a batch type equipment.
Figure 5B:
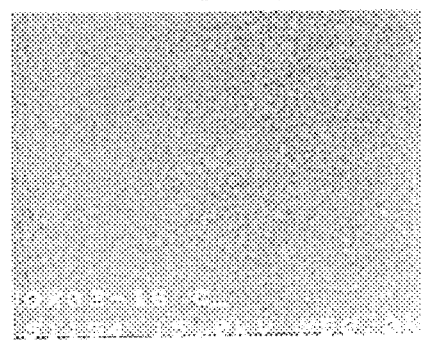
Figure 5C:
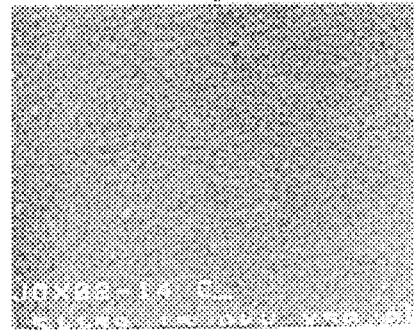
Figure 5D:
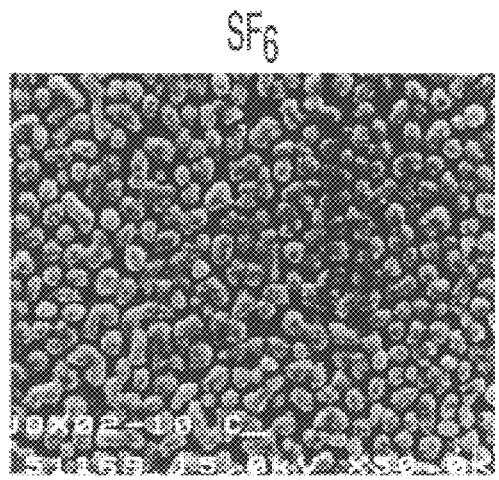
Figure 5E:
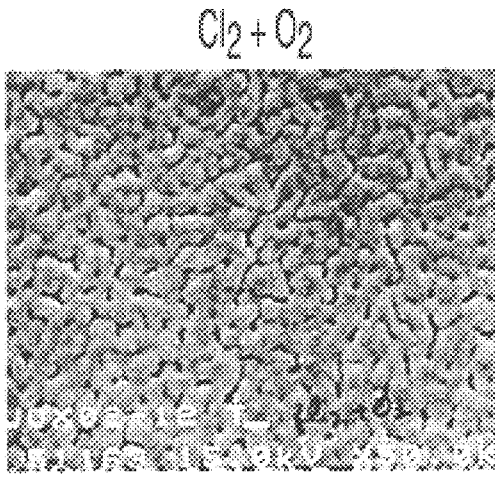

FIGS. 5a to 5e show SEM photographs of HSG silicon film grown at surface portion of amorphous silicon film in a batch type equipment, showing a condition of HSG silicon film growth on top of charge storage electrode according to each etching gas used in patterning of amorphous silicon film. Here, FIG. 5a shows a case of only using $C_2F_2$ gas, FIG. 5b shows a case of only using $CHF_3+CF_4$ gas and FIG. 5c shows a case of only using $CHF_3+Ar$ gas. That is, they show the cases in which the amorphous silicon film is patterned according to the conventional technology, and from the drawings, it can be seen the grain size of selective HSG silicon film is fine or the grain is almost not formed.

That is, the present invention is not significantly affected by the kind of HSG deposition equipment.

Other embodiment of the present invention uses HBr gas instead of $SF_6$ gas or $Cl_2+O_2$ gas at the time of 2-step selective etching of amorphous silicon film in an embodiment described above. The case of using HBr gas can prevent the remaining of carbon component so that almost same result as the case of using the $SF_6$ gas or $Cl_2+O_2$ can be expected. In addition, there is advantage that the use of HBr gas can obtain excellent etching bias.

Another embodiment of the present invention is not to perform 2-step etching as in an embodiment and other embodiment described above but to pattern the amorphous silicon film by only using an etching gas such as $SF_6$ gas, $Cl_2+O_2$ gas, HBr gas, etc. not containing carbon component and then to grow the selective HSG silicon film. In this case, the etching rate is slower than that in case of etching in 2-step by using carbon halide gas, therefore there is disadvantage of degradation of productivity, however this case is more advantageous in view of securing the grain size of HSG silicon film.

As described above, the present invention can prevent the suppression of growth of selective HSG silicon film due to the remaining of carbon component by limiting the carbon halide gas conventionally used at the time of patterning the hemisphere silicon grain charge storage electrode. In addition, accordingly, efficient grain size of HSG silicon film can be secured and therefore there is effect of contributing to the high integration of semiconductor device.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of forming a charge storage electrode having a selective hemispherical grains silicon film in a semiconductor device comprising:

a first step of forming contact holes in an insulation film deposited on a wafer;

a second step of depositing an amorphous silicon film on said insulation film;

a third step of selectively etching a part of amorphous silicon film by using a carbon halide gas as a main etching gas;

a fourth step of selectively etching the remaining part of said amorphous silicon film by using a silicon etching gas not containing carbon component; and a fifth step of selectively forming a hemisphere grains silicon film at surface portion of said amorphous silicon film after performing the fourth step.

2. The method of claim 1, wherein said silicon etching gas not containing carbon component comprises at least one of $SF_6$ gas, $Cl_2+O_2$ gas and HBr gas.

3. The method of claim 1, wherein said carbon halide gas comprises at least one of $C_2F_6$ gas, $CF_4$ gas, $CHF_3$ gas and $CCl_4$ gas.

4. The method of claim 3, wherein an inert gas is further used together with said carbon halide gas in said second step.

5. The method of claim 1, wherein said fourth step further comprises an annealing at a process pressure not exceeding $10^{-4}$ Torr and at temperature of at least 450° C.

6. A method of forming a charge storage electrode having a selective hemispherical grains silicon film, the method comprising:

depositing a first insulating layer on a substrate;

forming at least one contact hole in said first insulating layer;

depositing an amorphous silicon film on said first insulating layer, wherein said amorphous silicon film enters said contact hole;

etching a first portion of the amorphous silicon film with a carbon halide gas;

etching a second portion of the amorphous silicon film using a silicon etching gas not containing carbon; and selectively forming a hemisphere grains silicon film on an exposed surface of said amorphous silicon film, after etching said second portion of the amorphous silicon film.

7. The method of claim 6, wherein the step of depositing an amorphous silicon film on said first insulating layer results in the amorphous silicon film filling the contact hole and contacting the substrate.

8. The method of claim 6, wherein the silicon etching gas not containing carbon comprises at least one of $SF_6$ gas, $Cl_2+O_2$ gas and HBr gas.

9. A method of forming a charge storage electrode according to claim 8, wherein the step of depositing an amorphous silicon film on said first insulating layer results in the amorphous silicon film filling the contact hole and contacting the substrate.

10. The method of claim 6, wherein the carbon halide gas comprises at least one of of $C_2F_6$ gas, $CF_4$ gas, $CHF_3$ gas and $CCl_4$ gas.

11. The method of claim 10, wherein an inert gas is further used together with said carbon halide gas to etch the first portion of the amorphous silicon film.

12. The method of claim 6, wherein the step of selectively forming a hemisphere grains silicon film on an exposed surface of said amorphous silicon film comprises annealing the amorphous silicon film at a pressure not exceeding $10^{-4}$ Torr and at a temperature less than 450° C.

* * * * *